United States Patent
Pelletier et al.

(10) Patent No.: US 8,736,176 B2
(45) Date of Patent: May 27, 2014

(54) DEVICE AND METHOD FOR PRODUCING AND/OR CONFINING A PLASMA

(75) Inventors: Jacques Pelletier, Saint Martin d'Heres (FR); Stéphane Bechu, Chantesse (FR); Alexandre Bes, Vourey (FR); Ana Lacoste, Saint Martin le Vinoux (FR)

(73) Assignees: Centre National de la Recherche Scientifique (CNRS) (FR); Universite Joseph Fourier—Grenoble 1 (FR)

( * ) Notice: Subject to any disclaimer, the term of this patent is extended or adjusted under 35 U.S.C. 154(b) by 296 days.

(21) Appl. No.: 13/126,535

(22) PCT Filed: Oct. 28, 2009

(86) PCT No.: PCT/EP2009/064231
§ 371 (c)(1),
(2), (4) Date: Apr. 28, 2011

(87) PCT Pub. No.: WO2010/049456
PCT Pub. Date: May 6, 2010

(65) Prior Publication Data
US 2011/0215722 A1    Sep. 8, 2011

(30) Foreign Application Priority Data
Oct. 30, 2008   (FR) ...................................... 08 57392

(51) Int. Cl.
*H01J 7/24* (2006.01)
(52) U.S. Cl.
USPC ............................. 315/111.71; 118/723 MR
(58) Field of Classification Search
USPC ............... 315/244, 248, 344, 111.01–111.91; 313/231.31, 238, 325; 118/723 MW, 118/723 MR, 723 MA, 723 AN, 723 I
See application file for complete search history.

(56) References Cited

U.S. PATENT DOCUMENTS 5,216,329 A * 6/1993 Pelleteir .................... 315/111.41
(Continued)

FOREIGN PATENT DOCUMENTS

| FR | 2797372 A1 | 2/2001 |
| FR | 2838020 A1 | 10/2003 |

(Continued)

OTHER PUBLICATIONS

International Search Report, PCT/EP2009/064231, dated Dec. 1, 2009.

*Primary Examiner* — Alexander H Taningco
*Assistant Examiner* — Christopher Lo
(74) *Attorney, Agent, or Firm* — Lerner, David, Littenberg, Krumholz & Mentlik, LLP

(57) ABSTRACT

The invention relates to a device for producing and/or confining a plasma, said device comprising a chamber in the space of which the plasma is produced and/or confined, said chamber including a wall defining a housing inside the chamber and encompassing said space, wherein said device is characterized in that it comprises at least one assembly for producing and/or confining plasma, each assembly being composed of magnets having only an axial magnetization direction and being recessed in the wall defining the housing, so that the magnetization direction of all the magnets defining each assembly is substantially perpendicular to the housing defined by the wall and so that the assembly is substantially symmetrical to the housing, wherein the magnetic field lines do not extend through the wall of the chamber. The invention also relates to a method for producing and/or confining a plasma.

11 Claims, 6 Drawing Sheets

(56) References Cited

U.S. PATENT DOCUMENTS

| | | | | |
|---|---|---|---|---|
| 5,370,765 | A | * | 12/1994 | Dandl ............................ 216/69 |
| 5,975,014 | A | * | 11/1999 | Dandl .................... 118/723 MW |
| 6,407,359 | B1 | | 6/2002 | Lagarde et al. |
| 7,304,435 | B2 | | 12/2007 | Lacoste et al. |
| 7,574,974 | B2 | | 8/2009 | Lagarde et al. |
| 2003/0117080 | A1 | * | 6/2003 | Dandl et al. ............. 315/111.81 |

FOREIGN PATENT DOCUMENTS

| | | |
|---|---|---|
| FR | 2840451 A1 | 12/2003 |
| WO | 2008/009558 A1 | 1/2008 |
| WO | 2008/009559 A2 | 1/2008 |

* cited by examiner

DEVICE AND METHOD FOR PRODUCING AND/OR CONFINING A PLASMA

CROSS REFERENCE TO RELATED APPLICATIONS

The present application is a national phase entry under 35 U.S.C. §371 of International Application No. PCT/EP2009/064231, filed on Oct. 28, 2009, which claims priority from French Application No. 0857392, filed Oct. 30, 2008, the disclosures of which are incorporated by reference herein.

GENERAL FIELD OF THE INVENTION

The invention concerns a device for producing and/or confining a plasma, comprising a chamber in the space of which the plasma is produced or confined, said chamber comprising a wall defining a housing inside the chamber and encompassing the space.

The invention also concerns a method of producing and/or confining a plasma.

PRIOR ART

The confinement of plasmas in a space by permanent magnets has been used for many years universally, because of the increase in performance that it affords in terms of density and uniformity of the plasma.

Since 1974, the technique has not changed since the confinement of the plasma is achieved in general terms by placing at the periphery of the confinement space, inside or outside the walls of the chamber, permanent magnets presenting to the plasma alternating north and south polarities, and hence the name multipole magnetic confinement.

In 1975, a study was carried out in order to determine the best arrangement and optimum distance between permanent magnets. This study showed that it was continuous inline structures, rather than structures in a chessboard pattern or in a broken line, that procured the best confinement. On the other hand, the distance between magnets, which has a relatively flat maximum, appears to be less critical.

Finally, in 1992, better knowledge of multipole magnetic confinement mechanisms made it possible to propose, in order to improve the efficacy of the confinement, to close the multipole magnetic structures on themselves in the manner of "magnetron" structures.

The principle of multipole confinement of the plasma, and in particular of the electrons that produce the plasma, now appears to be well known. The charged particles that enter the region of influence of a multiple magnetic field:

1) either are reflected by this magnetic field and are returned to the region free from magnetic field from whence they came (a mechanism that will be referred as "mechanism 1");

2) or completely pass through the magnetic field region into the regions where their path is almost parallel to the magnetic field lines, since there is then no coupling between the charged particle and the magnetic particle (a mechanism that will be referred as "mechanism 2"). This is case with the charged particles that arrive from the zone without magnetic field, either directly to the pole of the magnets, or directly in the zero-intensity magnetic field zone situated between two magnets with the polarity (the case of alternating unitary magnets);

3) or are trapped in the multiple magnetic field by a collision mechanism (a mechanism that will be referred to as "mechanism 3").

In other words, the only charged particles that are lost for the plasma are:

firstly those that are trapped on field lines (mechanism 3) that pass through the physical surfaces, and secondly those that arrive from the volume free from magnetic field to the magnetic field line convergence regions (mechanism 2), that is to say either at the magnetic poles (maximum magnetic intensity) or between two magnets with the same polarity (zero minimum magnetic intensity). These convergence zones of the magnetic field lines are referred to as "cusps".

The energetic electrons that produce the plasma (referred to as fast or primary electrons) are not very sensitive to the self-maintained electrical field produced by the space charge of the plasma. Once trapped in the magnetic field $B_0$, as shown by FIG. 1, in the interval between two elastic or inelastic collisions, the electrons 6 oscillate between two mirror points M (where the intensity of the magnetic field is identical). The mirror points M are situated facing two opposite magnetic poles of the magnets 3. The electrons 6 oscillate between the points M while coiling around a mean field line 5. Their paths remain between two magnetic field lines of constant intensity.

Unlike the aforementioned fast electrons—not very sensitive to the electrical field of the plasma as stated—the ions and the low-energy electrons of the plasma (referred to as slow or thermal electrons), which also oscillate between two opposite magnetic poles, are for their part sensitive to the electrical field of the plasma and diffuse in the magnetic field collectively, under the influence of this electrical field.

Finally, apart from these oscillation and diffusion movements, the charged particles drift along and around the magnets, perpendicular to the plane that contains the vector of the magnetic field generated by the magnetic structure. It is for this reason that it is highly preferable to close on themselves the magnetic field structures (structures of the magnetron type, in a ring, comb or track) in order to avoid losses of charged particles at the ends of the continuous magnetic structures.

In multipole magnetic confinement structures, the plasma was originally produced by electrons emitted by thermoemissive filaments situated inside the confinement structure and biased negatively with respect to the chamber and the magnetic structure.

In fact, the plasma can also be produced in the chamber or at the periphery thereof by any appropriate means or method. In fact, any type of excitation of the plasma can be envisaged, whatever the excitation frequency and the excitation mode (Electron Cyclotron Resonance (or ECR), continuous discharge, pulsed continuous discharge, low-frequency discharge LF, radio-frequency discharge RF, surface wave, inductive discharge, magnetron discharge, etc).

It is even possible to use magnetic confinement structures to excite the plasma, either by the application to the structure of a continuous or pulsed continuous negative voltage, an LF or RF voltage, or by applying microwaves for excitation of the distributed cyclotron electron resonance (DCER) type.

One of the means for confining and producing large plasmas maintained by HF fields, principally in the microwave range (typically above 100 MHz), is to distribute elementary sources in arrays with two or three dimensions.

Microwave plasma sources distributed in a two-dimensional array make it possible to produce flat sources (or large warps), while sources distributed in a three dimensional array make it possible, by way of non-limitative examples, to produce plasma volumes, for example in a reactor of cylindrical or spherical geometry.

Examples of devices are disclosed in FR 2 797 372, FR 2 838 020 and FR 2 840 451.

FR 2 797 372 and FR 2 838 020 disclose devices for producing, at low pressure (from $10^{-2}$ to a few pascals), flat or cylindrical plasmas from elementary sources maintained by electron cyclotron resonance (ECR) microwaves. Producing plasmas by ECR requires the presence of a magnetic field that makes it possible to define regions where the frequency f0 of the microwave electrical field applied is equal to the frequency of gyration of the electrons in the magnetic field of amplitude B0, that is to say $$f0 = eB0/2\pi me \qquad (1)$$

where me is the mass of the electron.

In FR 2 797 372 and FR 2 838 020, the magnetic field is produced by a permanent magnet (magnetic dipole) fixed to the end of a coaxial microwave applicator. For this reason, these types of plasma are called multi-dipolar plasmas. In particular, and as shown as FIG. 1, FR 2 838 020 teaches disposing permanent magnets 3 at a distance from the walls 1, by means of rods 4, in order prevent the paths 6 of the electrons intersecting the walls 1 and therefore being collected on these surfaces. FIG. 1 shows that FR 2 838 020 proposes a solution that is satisfactory with regard to the confinement of the plasma 10 since no field line 5 encounters a surface or wall 1, thus preventing direct losses of electrons on the walls.

On the other hand, producing plasma by ECR as described in FR 2 797 372 and FR 2 838 020 has major drawbacks according to the operating conditions of the elementary sources, namely:

1) the plasma 10 is produced preferentially on the cylindrical part around the magnet 3 rather than on the front face of the magnet as is preferable in many applications;

2) the pressure range of this technique is limited to low pressures, typically one pascal (10 mtorr) since, as higher pressures, the plasma is then substantially produced on the rear face of the magnet 3 rather than the front face, on the use side. The plasma production technique therefore remains limited to the low pressure range;

3) in the case of a non-planar plasma source (cylindrical reactor), putting the permanent magnets at a distance from the wall reduces the useful volume of the plasma in the reactor.

As shown by FIG. 2, FR 2 840 451 for its part discloses a planar plasma source 10 where the microwaves are applied to the plasma by coaxial propagation applicators 9 terminating in a straight section. These applicators 9 being generally distributed in a square array, these types of plasma 10 are called matrix plasmas. In principle, the pressure range sought (10 to $10^3$ pascals) does not require a magnetic field, but FR 2 840 451 teaches the possibility of arranging a magnet 3 in the central core 11 of the applicator. In this case, the magnetic field lines 5 necessarily loop back on metal or dielectric walls 1 of the chamber. In this case, the electrons accelerated by ECR are all collected on the coaxial applicator 9, which is catastrophic with regard to the power balance of the plasma. Confinement of the plasma is ineffective, the magnet 3 serving solely to provide the ECR conditions essential for obtaining breakdown of the plasma 10 at low pressures (from around one pascal to a few tens of pascals).

For these reasons, WO 2008/009559 propose to remedy all the above drawbacks.

To this end, the solution proposed by WO 2008/009559 consists of distributing in the chamber either annular magnets with radial magnetisation, disposed at the periphery of the plasma (confinement of the plasma), or elementary sources in which an annular magnet with radial magnetisation is placed at the end of the coaxial structure feeding the microwaves.

The distribution of the magnets or sources comprising the magnets takes place in two- or three-dimensional arrays, for example rectangular or hexagonal, as shown by FIGS. 3a and 3B.

Only the magnetic field lines 5 at the front of a mid-plane 15 of the magnets 30 are situated on the plasma 10 side, as shown for example in FIGS. 4A and 4B.

With this type of magnetic configuration, the field lines 5 never pass through the mid-plane 15 of the magnet and the ECR zones generally surround the magnet 30, which makes it possible to overcome all the drawbacks described in the criticism of the prior art, namely:

1) the field lines 5 do not pass through any surface or wall 1 (the configuration of the field lines 5 of each permanent magnet 30 means that they go from one pole to the opposite pole without ever passing through the mid-plane 15 of the magnet 30), and therefore the electrons trapped around these field lines 5 remain properly confined;

2) if the magnet 30 has sufficient magnetisation, the ECR conditions are satisfied and the field lines 5 are situated on the front face of the coaxial structure, giving a production of the plasma towards the useful volume facing the applicator;

3) the device of WO 2008/009559 enables dense plasma to be produced within a wide pressure range (from $10^{-2}$ pascals up to $10^3$ pascals, with same applicator 9 and with maximum coupling efficacy), either with ECR coupling (resonant coupling), or with coupling by collisional absorption when the magnetic field becomes inoperative, that is to say when the frequency v of elastic collisions of the electrons becomes great compared with the angular frequency of the microwave electrical field, equal, at the ECR, to the cyclotron electron angular frequency ωc (v>>ωc).

Thus the magnetic field does not interfere with the coupling by collisional absorption, which takes over from the ECR when the pressure increases.

WO 2008/009559 allows extension in scale of the confinement and production of plasma. This is because there is no theoretical or even technological limitation on increasing the number of applicators, either on a flat surface or on a non-flat surface, for example cylindrical.

FIG. 13A shows the iso-B lines (broken lines) and the field lines (solid lines) for radial magnetisation magnets for cylindrical structures (radius R=10 mm, height Z=20 mm) made from SmCo.

The iso-B lines are repeated in FIG. 14A (broken lines) and the field lines are repeated in FIG. 14B (broken lines).

On the other hand, the device of WO 2008/009559 also has drawbacks. Radial magnetisation magnets are difficult to find commercially since they are difficult to produce, especially if the dimensions of the magnets are small, in particular with regard to the inside diameter of the magnet.

The device of WO 2008/009559 comprises composite magnetic structures associating various types of magnetisation. However, producing composite magnetic structures associating various types of magnetisation reduces the compactness of each source. In addition, such composite structures may prove to be very difficult or even impossible to produce technically. For example, in the case of a radial structure, producing a cylindrical structure as shown in FIG. 13A requires the assembly by adhesive bonding of several sectors, and hence it is extremely difficult or even impossible to produce certain very compact or composite structures.

A major drawback of radial-magnetisation structures (cf. FIG. 13A) is that the lines with the same magnetic field intensity (iso-b lines) are situated preferentially on either side of the opposite faces of the radial magnetic structure. In this case, a significant proportion of the microwave power emerging from the applicator (FIG. 14A) may radiate outside the applicator without encountering electron cyclotron resonance (ECR) conditions, giving a non-optimised coupling of the microwaves to the plasma.

A device for producing and confining a plasma in a space is also known from WO 2008/009558. In the device of WO 2008/009558 the magnetic configuration necessarily comprises at least one pair of concentric permanent magnets with axial magnetisation, magnets the magnetisations of which are necessary alternating. The reduction in the losses in the plasma is therefore not optimum since some field lines join the opposite poles of the two concentric magnets or of the same magnet.

PRESENTATION OF THE INVENTION

The aim of the invention is to solve at least one of the aforementioned drawbacks.

To this end, a device according to claim 1 is proposed according to the invention.

The invention is advantageously supplemented by the features of claims 2 to 9.

The invention also concerns a method of producing and/or confining a plasma in an aforementioned device.

The invention has numerous advantages.

Because the magnetic assembly is composed of magnets solely with an axial magnetisation direction, the permanent magnet magnetic structure is much simpler to produce, while being capable of producing magnetic configurations in which the field lines never pass through the mid-plane of the magnet or the walls of the chamber.

The invention enables large, dense plasmas to be confined, from the lowest pressures ($10^{-2}$ pascals or less) up to around ten pascals (the pressure at which the magnetic confinement becomes ineffective). It is thus possible to operate within a wide range of pressures, either with ECR coupling or with coupling by collisional absorption when the magnetic field becomes inoperative, that is to say when the frequency $\nu$ of elastic collisions of the electrons becomes large compared with the angular frequency $\omega 0 = 2\pi f0$ of the microwave electrical field ($\nu \gg \omega 0$), equal, at the ECR, to the cyclotron electron angular frequency $\omega c$ ($\omega 0 = \omega c$).

The invention proposed can find very numerous applications, in particular in the field of surface treatments, such as etching, deposition (PAPVD or PAPVD) or ion implantation by plasma immersion, to cite only a few examples. The application of the invention to lighting can also be cited. With regard to application to lighting, the invention affords significant advantages compared with known current devices. This is because the plasmas produced according to the invention can be produced with very low powers (of the order of one watt) without delay to switching on (immediate switching on) and without microwave radiation (total absorption of the microwaves), advantages compared with current low-consumption lamps using much lower RF frequencies.

The invention enables plasma to be produced in the pressure range from $10^{-3}$ to a few $10^3$ pascals, that is to say around $10^{-5}$ to 10 torr (1 torr=133 pascals) with a view to applications to:

surface treatments (cleaning, sterilisation, etching, deposition, ion implantation, etc), the production of new species (atoms, radicals, metastables, charged species, photons), the production of ion sources for any application requiring ion beams (sources of mono- or multi-charged ions), as well as any field requiring the production, on large surfaces or large volumes, of uniform plasma.

Another advantage afforded by the invention is the possibility of producing a confinement structure where the magnetic field lines are all situated in the same half-space, giving an ideal confinement of the plasma in the low-pressure domain.

This is because, with this type of magnetic configuration, the field lines never pass through the mid-plane of the magnet and the ECR zones generally surround the magnet, which overcomes the drawbacks of the prior art, namely:

1) the field lines do not pass through any surface or wall, and therefore the electrons trapped around these field lines remain properly confined;

2) if the magnet has sufficient magnetisation, the ECR conditions and the field lines are situated on the front face of the coaxial structure, leading to a production of the plasma towards the useful volume.

There is no longer any reduction in the useful volume of plasma in the reactor since the device advantageously does not comprise any rods supporting the magnets towards the inside of the chamber.

Another advantage afforded by the invention is the extension in scale of the confinement and of the production of plasma. This is because there is no theoretical or even technological limitation to increasing the number of applicators, either on a flat surface or on a non-flat surface, for example cylindrical. It is possible to supply with microwave power as many applicators as required by as many independent generators as necessary, with or without power division. Each applicator can be supplied by means of a coaxial cable since the microwave power necessary to each applicator is relatively small, and hence the great reliability of the global device.

Another advantage is the possibility of producing dense plasmas throughout the pressure range defined in the invention, from $10^{-2}$ pascals up to $10^3$ pascals with the same applicator, and with maximum coupling efficacy. This is because, by virtue of the invention, it is possible to maintain the plasma both in the ECR regime (resonant coupling) and in the domain outside ECR, at higher pressure (coupling by collisional absorption).

Another advantage is that, for commercially available magnets and conventional operating conditions (for example a microwave frequency f0=2.45 GHz), the magnetic field intensity lines B0 completely surround each magnet so that the microwaves cannot radiate outside the applicator zone without passing through an ECR coupling zone, giving optimum coupling of the microwaves with the plasma at low and very low pressure.

For ECR, it is possible to use microwave frequencies (5.8 GHz, 2.45 GHz, 920 MHz), but also lower frequencies (up to around 100 MHz).

For each elementary source, it is possible to provided unitary supplies by power transistors, including at 2.45 GHz, or even 5.8 GHz.

FIG. 13B shows the iso-B lines (broken lines) and the field lines (solid lines) for axial magnetisation magnets in opposite orientations (that is to say the assembly is substantially symmetrical with respect to the envelope) according to the invention for cylindrical structures (radius R=10 mm, height Z=20 mm) made from SmCo.

The iso-B lines are repeated in FIG. 14A (solid lines) and the field lines are repeated in FIG. 14B (solid lines). FIG. 14A indicates the ECR conditions for microwaves at 2.45 GHz (875 gauss or 0.0875 tesla) for the radial-magnetisation structure (broken line) and the opposite-orientation axial-magnetisation structure (solid line) for magnetic structures made from samarium cobalt with the same dimensions (height Z=20 mm, radius R=10 mm).

Another advantage is that the magnetic structures according to the invention are very compact. This is because, in order to obtain very high densities from very large plasma sources, it is necessary to be able to assemble on a given surface the largest number of applicators per unit surface, in order to be able to couple to the plasma the greatest density of microwave power per unit surface. Thus producing magnetic structures having a single type of magnetisation increases the compactness of each source and provides the possibility of technical implementation thereof.

Another advantage is thus the ease of producing a magnetic structure according to the invention. In the invention, producing a structure with opposite orientations (that is to say symmetrical with respect to the envelope) is very easy since it suffices to bond together two magnets with opposite magnetisations (see FIG. 13B).

Another advantage concerns the magnetic configuration generated by the magnetic structure. In the invention, although the field lines have a similar trend in both cases (radial magnetisation and opposite-orientation axial magnetisation) as indicated in FIG. 14B, the lines with the same magnetic field intensity (iso-B lines) completely surround the magnetic structure (FIGS. 13B and 14A). In this case, the microwave power output by the applicator (FIG. 14A) cannot radiate outside the applicator without encountering ECR conditions, giving perfectly optimised coupling of the microwaves to the plasma.

PRESENTATION OF THE FIGURES

Other features, aims and advantages of the invention will emerge from the description, which is purely illustrative and non-limitative, and must be read with regard to the accompanying drawings, in which:

FIGS. 1 and 2, already commented on, show schematically assemblies according to the prior art;

Figure 14A:
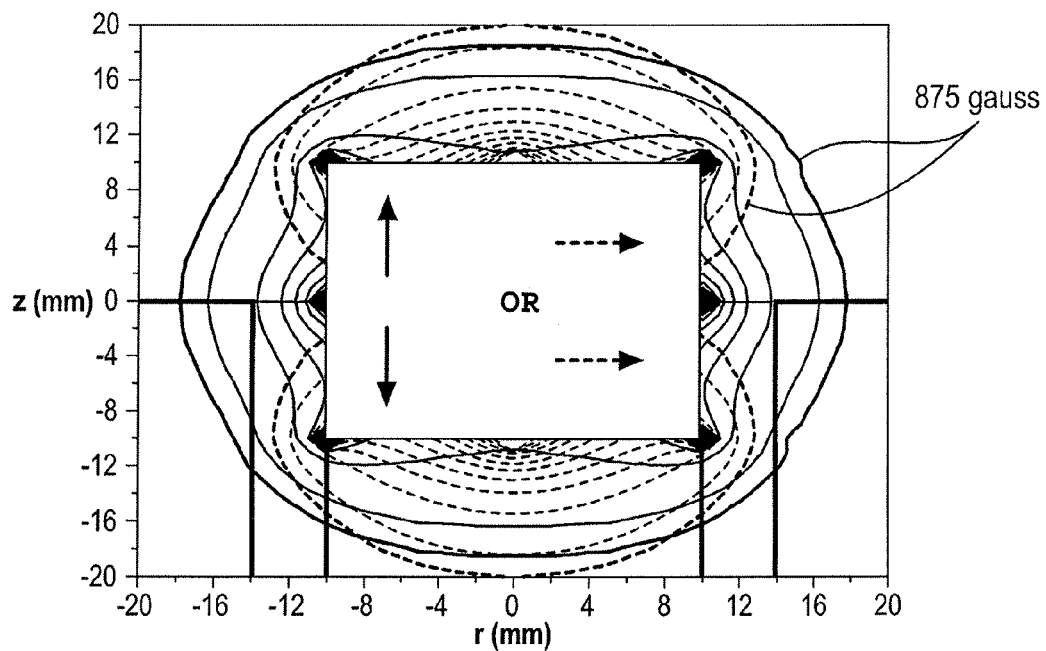
Figure 14B:
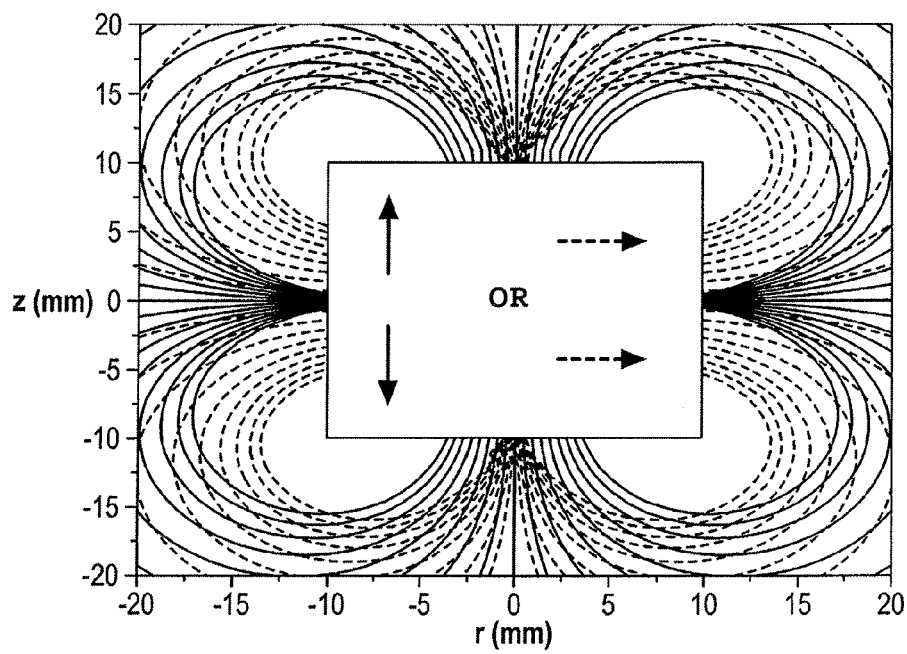

FIG. 14A shows the iso-B lines for ECR conditions for microwaves at 2.45 GHz (875 gauss or 0.0875 tesla) for the radial-magnetisation structure (broken line) and the opposite-orientation axial-magnetisation structure (solid line) for magnetic structures made from samarium cobalt (identical magnetisation) of the same size (height Z=20 mm, radius R=10 mm); and FIG. 14B shows the field lines for ECR conditions for microwaves at 2.45 GHz (875 gauss or 0.0875 tesla) for the radial-magnetisation structure (broken line) and the opposite-orientation axial-magnetisation structure (solid line) for magnetic structures made from samarium cobalt (identical magnetisation) of the same size (height Z=20 mm, radius R=10 mm).

In all the figures, the similar elements bear identical numerical references.

DETAILED DESCRIPTION

In order to confer great efficacy of confinement and/or production for the plasmas on a multipole magnetic structure, it is proposed according to the invention to ensure that the paths of the charged particles issuing from the plasma and trapped around a magnetic field line do not encounter any walls (losses through mechanism 3). For this purpose, it is necessary for the paths of the trapped electrons to be free from any obstacle between two mirror points M of equal magnetic field intensity. There is thus proposed according to the invention a device for producing and/or confining a plasma 10, visible more particularly in FIGS. 5A to 12C.

As shown by FIGS. 5A, 6A, 7A, 8A, 9A, 10A and 11 for example, the device comprises mainly a chamber 13 in the space of which the plasma 10 is produced or confined.

The chamber 13 comprises a wall 1 delimiting a housing 15 internal to the chamber and encompassing the space.

In the remainder of the present description, "chamber" means the receptacle in the space of which the plasma 10 is produced or confined, any one device being able thus to be divided into several chambers, for example by internal partitions or additional walls separating the device.

The housing corresponds to the surface of the wall 1 internal to the chamber 13.

The device comprises at least one plasma production and/or confinement assembly 30.

Each assembly 30 is composed of magnets 3 solely with an axial magnetisation direction arranged with respect to the housing 15, so that the magnetisation direction of all the magnets 3 making up each assembly 30 is substantially perpendicular to the housing 15.

In addition, each assembly 30 is recessed in the wall 1 defining the housing 15, and the magnets 3 are arranged together so that the assembly 30 is substantially symmetrical with respect to the housing 15.

With this configuration, the magnetic field lines 5 do not pass through the wall 1 of the chamber.

It will be understood that, if the assembly 30 is not perfectly symmetrical with respect to the housing 15, that is to say the assembly 30 is slightly too greatly recessed in the wall, or slightly too little recessed in the wall, the device according to the invention also functions, but with a much lower efficiency, given that some field lines pass through the wall of the chamber and the electrons are lost for the plasma 10.

Figure 5A:
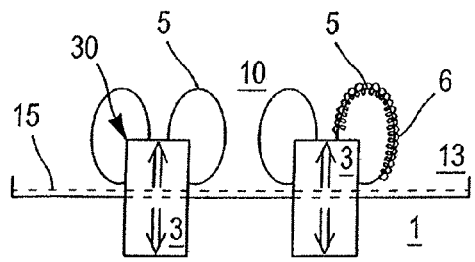
FIGS. 5A and 5B show schematically respectively a view in section and a front view of a first possible embodiment of the invention.
Figure 5B:
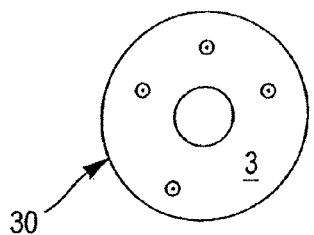

FIGS. 5A and 5B show schematically that the assembly 30 comprises two annular magnets 3 symmetrical with respect to the housing 15.

Such a configuration of the assembly 30 makes it possible to achieve a confinement of the plasma, without the paths 6 of the trapped electrons encountering a wall 1 of the chamber.

In general terms, each annular magnet 3 has mainly an axial magnetisation, and the assembly 30 has symmetry with respect to a plane perpendicular to the axial magnetisation direction, which can be called a mid-plane 50 of the assembly 30. For better efficiency, the plane and the housing 15 are made to coincide when the assembly 30 is mounted in the wall 1.

Figure 6A:
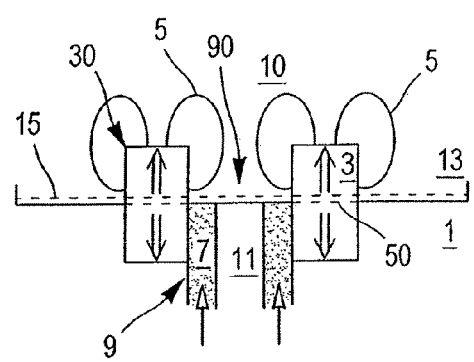
FIGS. 6A and 6B show schematically respectively a view in section and a front view of a second possible embodiment of the invention.
Figure 6B:
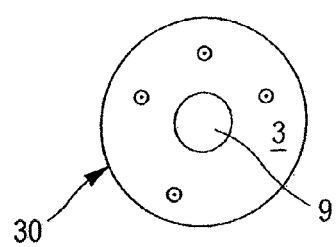

As shown by FIGS. 6A and 6B, in order to achieve a production of plasma 10, the assembly 30 can also comprise at least one elementary plasma source comprising a coaxial microwave applicator 9.

The applicator 9 passes through the wall 1 of the chamber and comprises a central core 11.

Each annular magnet 3 is centred on the central core 11 of the applicator 9. The annular magnets 30 with axial magnetisation are placed around a free end 90 of the coaxial applicator bringing the microwaves and are recessed in the wall 1 of the chamber at the external periphery of the applicator 9.

In the case of confinement and/or production, only the magnetic field lines 5 in front of the longitudinal mid-plane 50 of the assembly 30 are situated on the plasma side 10, as shown by FIGS. 5A and 6A.

The device in FIGS. 6A and 6B in particular solves the difficulties of the prior art.

This is because the plasma is confined effectively. It can be produced facing the applicator 9. In addition, the magnetic field B0 does not interfere with the coupling by collisional absorption, which takes over from ECR when the pressure increases. This is because the configuration of the field lines 5 of the assembly 30 mean that they go from one pole to the opposite pole without ever passing through the mid-plane 50 of the assembly 30.

Figure 12B:
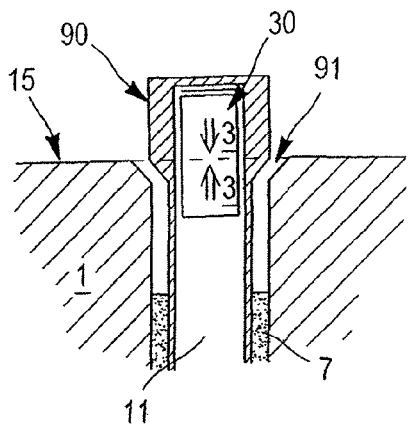
FIGS. 12A to 12C show schematically sections of possible embodiments of an applicator according to the invention.
Figure 12A:
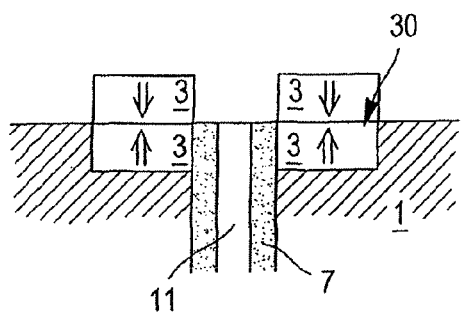

The coaxial applicator 9 preferentially comprises a dielectric material 7 disposed around the central core 11, at the wall 1 of the chamber (see also FIG. 12A).

The dielectric material 7 can be disposed below the level of the wall (see FIGS. 12B and 12C).

The free end 90 of the applicator may have several possible forms. By way of non-limitative example, the free end 90 may have a larger cross section than the cross section of the central core 11 (see FIGS. 12B and 12C). The applicator then preferentially comprises chicanes 91 formed in the wall 1, so that firstly the space between the central core 11 and the wall is substantially always identical and secondly in order to avoid metallisation of the dielectric material 7 in the applications of the device to the sputtering of metals (the material 7 is protected by the free end 90).

Figure 12C:
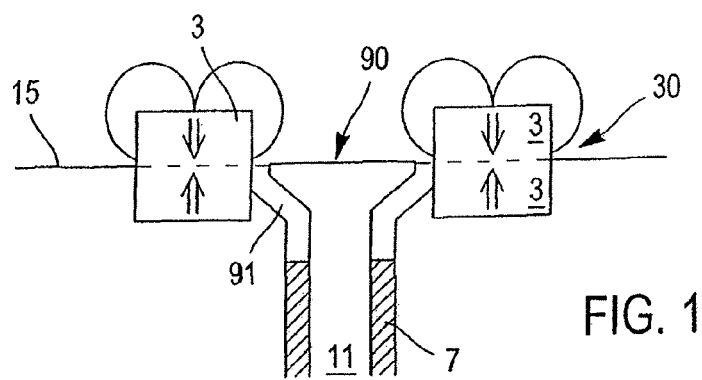
Figure 13A:
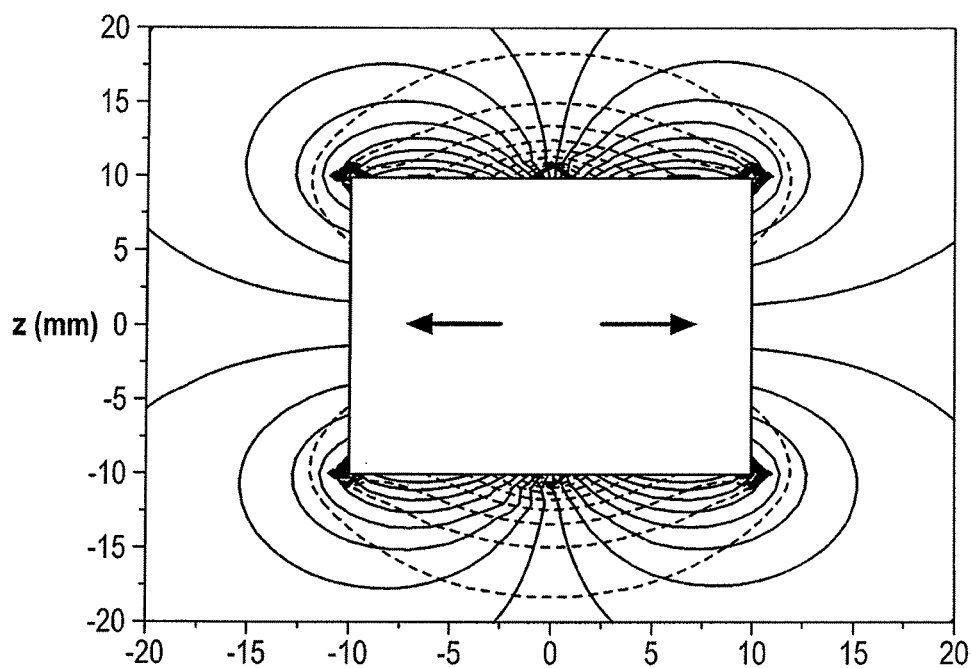
FIGS. 13A and 13B show schematically field lines (solid lines) and iso-B lines (broken lines) respectively for a radial-magnetisation magnetic structure and for a magnetic structure with opposite-orientation axial magnetisation (symmetrical with respect to the envelope)
Figure 13B:
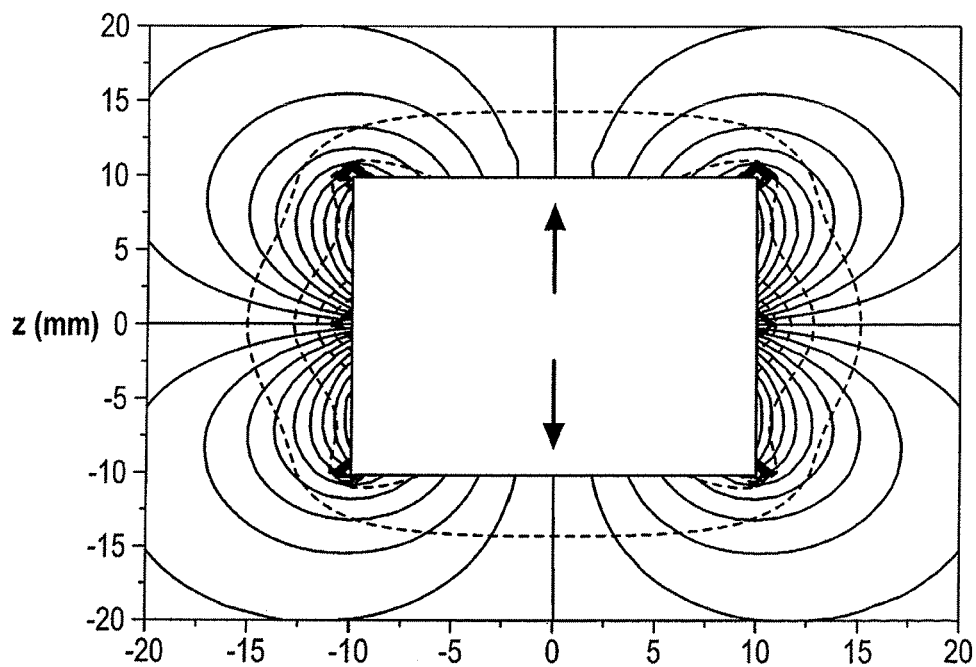

In the case of FIG. 12C, the inside diameter of the assembly 30 is greater than the outside diameter of the free end 90.

In the case of FIG. 12B, the free end 90 is situated above the wall 1. It can then cover the assembly 30, for example situated inside the central core 11, but always so as to be symmetrical with respect to the housing 15.

The material 7 is preferentially disposed over at least part of the length of the applicator 9.

The dielectric material can also be formed by vacuum at low and very low pressure (which corresponds to the operating conditions of the device).

A device according to the invention, for producing a device for confining a large-sized plasma 10, comprises, in two- or three-dimensional arrays, a plurality of axial-magnetisation assemblies 30, disposed at the periphery of the plasma 10. The denser the array of assemblies, the denser the plasma and the more it is located towards the centre of the space in the chamber.

The device can also comprise a plurality of assemblies 30 each comprising an applicator 9.

Figure 1:
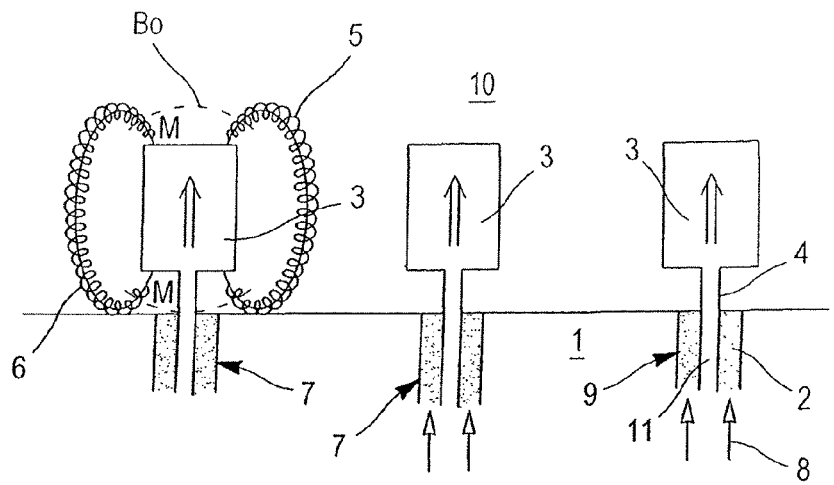
Figure 2:
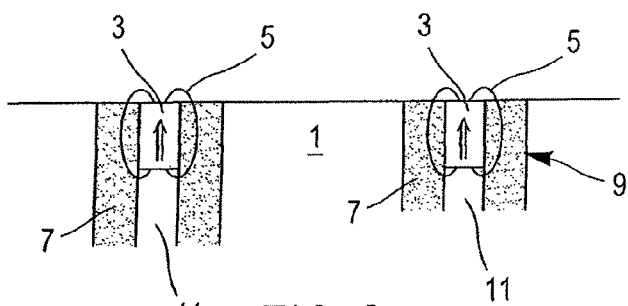
Figure 3A:
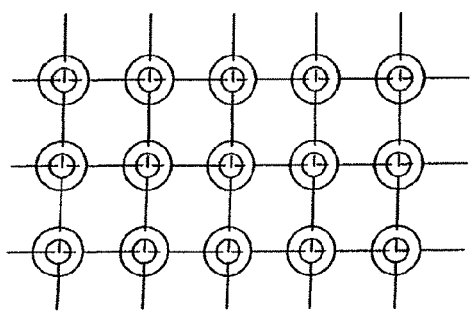
FIGS. 3A and 3B show schematically two possible examples of two-dimensional arrays.
Figure 3B:
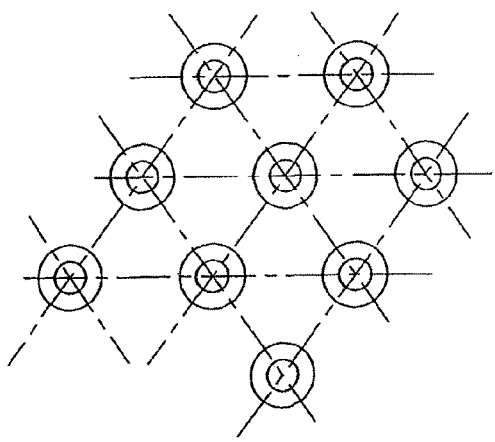
Figure 4A:
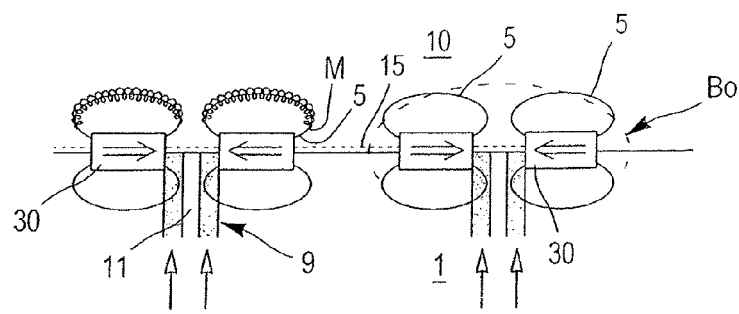
FIGS. 4A and 4B show schematically respectively a view in section and a front view of a known embodiment.
Figure 4B:
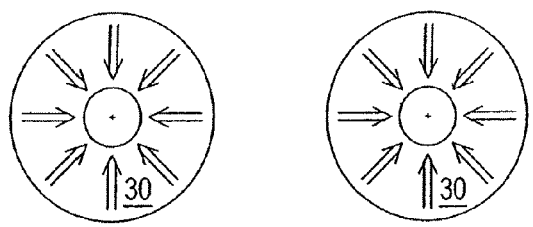

Each two- or three-dimensional array is for example rectangular or square, as shown in FIG. 3A, or hexagonal as shown in FIG. 3B.

Thus, for assemblies distributed in two- or three-dimensional arrays, the device has a magnetic structure:

firstly generating, by ECR (that is to say capable of delivering the magnetic field of intensity B0 necessary for the ECR coupling), a plasma 10 substantially in the direction facing the applicators 9, and secondly allowing, according to the form of the free end 90 of the applicator 9, functioning within a wide range of pressures, either by ECR coupling of the microwave electrical field with the electrons (resonant coupling) or, at higher pressure, by coupling by collisional absorption, when the magnetic field becomes inoperative.

Each assembly may have any polarity to the plasma, but the assemblies 30 distributed in two- or three-dimensional arrays present to the plasma 10 preferentially all the same axial magnetisation direction, with respect to the walls 1 or the applicators 9 that they surround, in order to prevent the magnetic field lines of an assembly looping back onto the opposite pole of a mirror assembly passing through the mid-plane 50 of the assembly, and consequently passing through a wall 1 of the chamber.

Only some of the assemblies 30 (one assembly 30 out of two, or one row out of two of assemblies 30, by way of non-limitative examples) can be supplied with microwaves by an applicator 9.

The invention may have numerous variants with respect to the configurations proposed in FIGS. 5A to 6B. These variants concern in particular the position of the assembly 30 with respect to the coaxial applicator 9, and/or the form of the free end 90 of the applicator (FIG. 12).

Figure 7A:
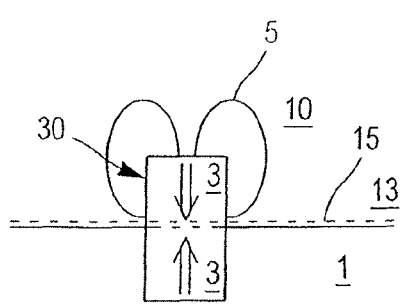
FIGS. 7A and 7B show schematically respectively a view in section and a front view of a third possible embodiment of the invention.
Figure 7B:

FIGS. 7A and 7B show that the confinement assembly 30 can be composed of a bar having two axial-magnetisation magnets 3, recessed in the wall 1 of the chamber and arranged so as to be symmetrical with respect to the housing 15 (it should be noted that in this case the assembly 30 presents to the plasma a polarity opposite to that presented to the plasma in FIGS. 5 and 6 for example, which, it will be recalled, has no importance for a device comprising only one assembly).

Figure 8A:
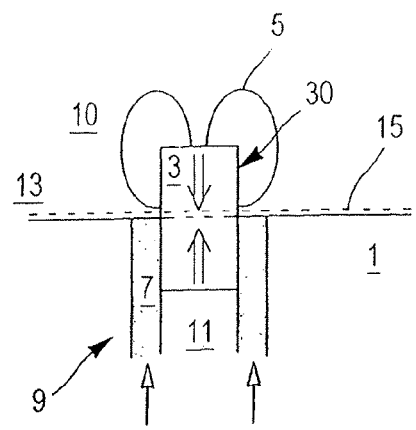
FIGS. 8A and 8B show schematically respectively a view in section and a front view of a fourth possible embodiment of the invention.
Figure 8B:
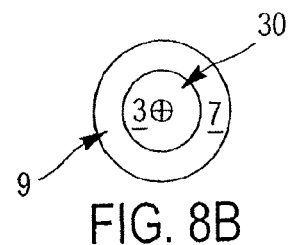

FIGS. 8A and 8B show that the assembly 30 according to FIGS. 7A and 7B may also comprise an applicator 9, the magnets 3 of axial magnetisation direction then being able to be recessed in the central core 11 of an applicator 9.

Figure 9A:
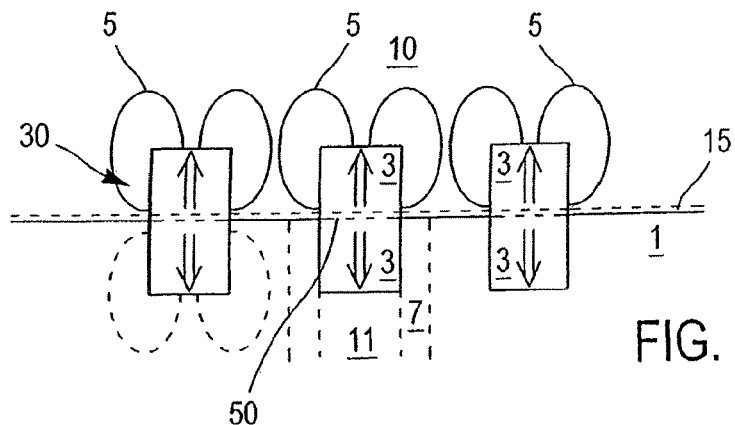
FIGS. 9A and 9B show schematically respectively a view in section and a front view of a fifth possible embodiment of the invention.
Figure 9B:
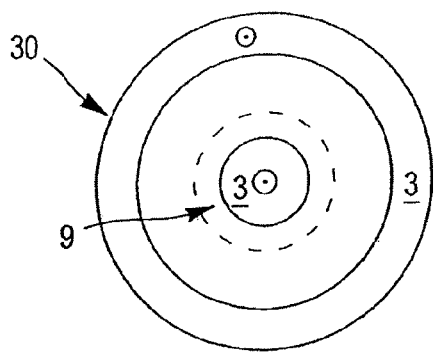

FIGS. 9A and 9B show that each assembly 30 can comprise two circular magnets 3 symmetrical with respect to the housing 15, centred around two magnets 3 in the form of bars, also symmetrical with respect to the housing 15.

As can be seen in FIGS. 9A and 9B, the magnets 3 all present to the plasma 10 preferentially the same axial magnetisation direction with respect to the walls 1, in order to prevent magnetic field lines of a magnet 3 looping back onto the opposite pole of another magnet 3 passing through the mid-plane 50 of the assembly. The broken lines show that the applicator 9 is optional in the assembly 30, according to the applications chosen.

Figure 10A:
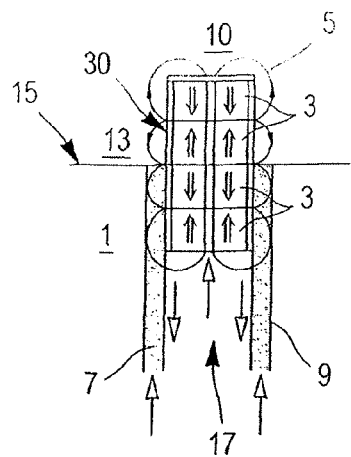
FIGS. 10A and 10B show schematically respectively a view in section and a front view of a sixth possible embodiment of the invention.
Figure 10B:
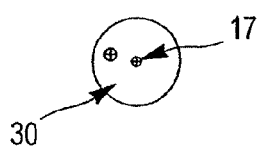

FIGS. 10A and 10B show that it is possible to superimpose magnets 3 on other magnets 3 in the assembly 30 provided that the assembly 30 remains symmetrical with respect to the housing 15.

Figure 11:
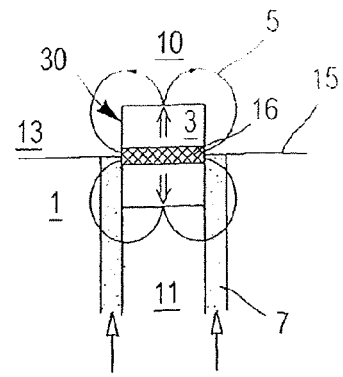
FIG. 11 shows schematically respectively a view in section of a seventh possible embodiment of the invention.

FIG. 11 shows that it is possible to interpose an element 16 with high magnetic permeability (for example a block of soft iron) or with low relative magnetic permeability (for example equal to 1) between the two magnets 3 of the assembly 30, provided that the assembly 30 remains symmetrical with respect to the housing 15.

The element 16 makes it possible to work on the field lines 5 and to move them away from the walls of the chamber.

These variants, presented by way of non-limitative examples, enable the elementary plasma sources to be optimised according to the application or method sought (simple confinement of the plasma or confinement and production of plasma, useful pressure domain, etc). In particular, in order, under certain operating conditions, to prevent coupling of the plasma in the coaxial structure, it is often preferable, as seen, to use an applicator completely or partially filled with dielectric material 7.

The annular magnets 3 of the assemblies 30 can also have varied forms: circular, polygonal (square, hexagonal, octagonal, decagonal, etc). But the circular annular form is by far the most common and the simplest to use.

Likewise the bar in FIG. 7 preferentially has symmetry of revolution, but may have other geometries.

Naturally, the confinement and production of very dense plasmas (beyond $10^{10}$ cm$^{-3}$) require cooling of the magnetic and coaxial structures, for example by circulation 17 of a gaseous or liquid heat-transfer fluid (as shown in FIG. 10 for example).

With the technology described, it is possible to produce either large flat sources, or cylindrical spherical sources and/or chambers, according to the application sought.

The microwave frequency used is not critical and it is therefore possible to use one of the ISM frequencies such as 915 MHz or 2.45 GHz, or even 5.8 GHz. For excitation of the plasma at electron cyclotron resonance by microwaves at 2.45 GHz, the resonance condition (B0=0.0875 tesla) is easily fulfilled by conventional permanent magnets, such as made from samarium-cobalt, or even barium ferrite or strontium ferrite. This is even more the case at 100, 200 or 300 MHz, where the cost of the power transistors is much lower than at 915 MHz or 2.45 GHz. The frequencies given by way of example are of course not limitative.

The invention claimed is:

1. A device for producing and/or confining a plasma, comprising:
   a chamber in the space of which the plasma is produced and/or confined, said chamber comprising a wall having a wall surface internal to the chamber and encompassing the space; and
   one or more assemblies for producing and/or confining plasma, each assembly being composed of at least one pair of joined magnets arranged end to end along an axial magnetisation direction, wherein the magnets of each pair have opposite magnetisation directions and wherein magnet ends having the same magnetic pole face each other at the junction between the magnets of each pair, each assembly being partially recessed in the wall of the chamber, such that the direction of magnetisation of all the magnets making up each assembly is substantially perpendicular to the wall surface and such that each assembly is substantially symmetrical with respect to the wall surface, the magnetic field lines not passing through the wall of the chamber.

2. The device of claim 1, comprising a plurality of assemblies arranged in the wall surface in order to form a two-dimensional or three-dimensional array.

3. The device of claim 2, wherein the array is square or hexagonal.

4. The device of claim 1, wherein at least one assembly also comprises at least one elementary plasma source comprising a coaxial microwave applicator comprising a central core, the applicator passing through the wall of the chamber.

5. The device of claim 4, wherein the assembly comprises magnets with an axial magnetisation direction recessed in the central core of the applicator.

6. The device of claim 4, wherein the assembly comprises magnets with an axial magnetisation direction recessed in the wall of the chamber at the external periphery of the applicator.

7. The device of claim 1, wherein the assembly comprises an element made from soft iron or with a relative magnetic permeability equal to 1.

8. The device of claim 4, wherein the coaxial applicator comprises a dielectric material disposed around the central core, at least over part of the length of the applicator, or comprises vacuum at low and very low pressure.

9. The device of claim 4, wherein each magnet delivers a magnetic field of amplitude B0 that satisfies the equation f0=eB0/2πme where:
   f0 is the frequency of the microwave electrical field applied by the coaxial applicator,
   e is the electron charge, and
   me is the mass of the electron,
to enable plasma to be produced at low pressure by electron cyclotron resonance.

10. A method of producing and/or confining a plasma in a chamber, said chamber comprising a wall having a surface internal to the chamber, said wall surface encompassing a space in which the plasma is produced and/or confined, said method comprising a step wherein one or more plasma production and/or confinement assemblies are provided, each assembly being composed of at least one pair of joined magnets arranged end to end along an axial magnetisation direction, wherein the magnets of each pair have opposite magnetisation directions and wherein magnet ends having the same magnetic pole face each other at the junction between the magnets of each pair, each assembly being partially recessed in the wall, such that the magnetisation direction of all the magnets making up each assembly is substantially perpendicular to the wall surface and such that the assembly is substantially symmetrical with respect to the wall surface, the magnetic field lines thus passing through the wall of the chamber to a minimum extent.

11. A device for producing and/or confining a plasma, comprising a chamber in the space of which the plasma is produced and/or confined, said chamber comprising a wall having a wall surface internal to the chamber and encompassing the space, said device comprising:
   a plasma source comprising a coaxial microwave applicator passing through the wall, said coaxial microwave applicator having a free end through which microwaves are brought to the chamber; and
   at least one assembly arranged at the free end of the coaxial microwave applicator, said at least one assembly comprising at least one pair of joined magnets arranged end to end along an axial magnetisation direction, wherein the magnets of each pair have opposite magnetisation directions and wherein magnet ends having the same magnetic pole face each other at the junction between the magnets of each pair, each assembly being partially recessed in the wall of the chamber, such that the direction of magnetisation of all the magnets making up each assembly is substantially perpendicular to the wall surface and such that the assembly is substantially symmetrical with respect to the wall surface, the magnetic field lines not passing through the wall of the chamber.

* * * * *